United States Patent
Kim et al.

(10) Patent No.: US 8,877,583 B2
(45) Date of Patent: Nov. 4, 2014

(54) METHOD OF MANUFACTURING A SEMICONDUCTOR DEVICE

(71) Applicants: Jin-Bum Kim, Seoul (KR); Young-Pil Kim, Hwaseong-si (KR); Kwan-Heum Lee, Suwon-si (KR); Sun-Ghil Lee, Hwaseong-si (KR)

(72) Inventors: Jin-Bum Kim, Seoul (KR); Young-Pil Kim, Hwaseong-si (KR); Kwan-Heum Lee, Suwon-si (KR); Sun-Ghil Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/728,622

(22) Filed: Dec. 27, 2012

(65) Prior Publication Data

US 2013/0171818 A1 Jul. 4, 2013

(30) Foreign Application Priority Data

Dec. 29, 2011 (KR) .......................... 10-2011-0145433

(51) Int. Cl.
| | |
|---|---|
| H01L 21/8242 | (2006.01) |
| H01L 27/108 | (2006.01) |
| H01L 21/285 | (2006.01) |
| H01L 21/768 | (2006.01) |
| H01L 49/02 | (2006.01) |

(52) U.S. Cl.
CPC ........ *H01L 21/285* (2013.01); *H01L 27/10855* (2013.01); *H01L 21/76889* (2013.01); *H01L 21/76849* (2013.01); *H01L 21/76843* (2013.01); *H01L 28/91* (2013.01)

USPC .......... 438/253; 438/254; 438/649; 438/664; 257/E21.619

(58) Field of Classification Search
USPC ......... 438/253–256, 649, 651, 655, 660–664, 438/301; 257/E21.619
See application file for complete search history.

(56) References Cited

U.S. PATENT DOCUMENTS

| | | | |
|---|---|---|---|
| 6,265,262 B1 | 7/2001 | Okuno et al. | |
| 7,547,607 B2 | 6/2009 | Moon et al. | |
| 7,919,385 B2 | 4/2011 | Nakamura | |
| 2006/0030116 A1* | 2/2006 | Moon et al. | 438/386 |
| 2012/0122288 A1* | 5/2012 | Hsieh et al. | 438/308 |

FOREIGN PATENT DOCUMENTS

| | | |
|---|---|---|
| KR | 1020020084596 A | 11/2002 |
| KR | 1020060010922 A | 2/2006 |
| KR | 1020060013278 A | 2/2006 |
| KR | 1020060122222 A | 11/2006 |
| KR | 1020080064498 A | 7/2008 |

* cited by examiner

*Primary Examiner* — Thanhha Pham
(74) *Attorney, Agent, or Firm* — Myers Bigel Sibley & Sajovec, PA

(57) ABSTRACT

In a method of forming an ohmic layer of a DRAM device, the metal silicide layer between the storage node contact plug and the lower electrode of a capacitor is formed as the ohmic layer by a first heat treatment under a first temperature and an instantaneous second heat treatment under a second temperature higher than the first temperature. Thus, the metal silicide layer has a thermo-stable crystal structure and little or no agglomeration occurs on the metal silicide layer in the high temperature process. Accordingly, the sheet resistance of the ohmic layer may not increase in spite of the subsequent high temperature process.

10 Claims, 14 Drawing Sheets

METHOD OF MANUFACTURING A SEMICONDUCTOR DEVICE

CROSS-REFERENCE TO RELATED APPLICATIONS

This application claims the benefit of Korean Patent Application No. 10-2011-0145433 filed on Dec. 29, 2011 in the Korean Intellectual Property Office, the disclosure of which is incorporated herein in its entirety by reference.

BACKGROUND

1. Field

Example embodiments relate to a semiconductor device and a method of manufacturing the same, and, more particularly, to a semiconductor device having a cylindrical capacitor and a method of manufacturing the same.

2. Description of the Related Art

As the integration degree of semiconductor devices increases, the design rule of the semiconductor devices has been decreased and, thus, the cell size of the semiconductor memory devices has also been reduced. Particularly, DRAM (dynamic random access memory) devices, each of which includes a single access transistor and a single cell capacitor where electronic data is programmed in the cell capacitor, typically require a minimal capacitance for reading and programming the data in spite of the reduction of the occupation area of the capacitor.

A three-dimensional cylindrical capacitor has been widely used for obtaining the minimal capacitance for operating the DRAM device in view of area reduction of the cell size. In the cylindrical structure of the capacitor of the DRAM device, the surface area of electrodes of the capacitor can be enlarged as much as possible and, thus, the capacitance decrease may be reduced or minimized due to the increase of the surface area of the electrode. For example, a metallic capacitor of which the upper and/or lower electrodes comprise metal has been widely used for the capacitor of the DRAM device, and, more particularly, a metal-insulator-metal (MIM) capacitor has been most widely used for the capacitor of the DRAM device.

According to the conventional cylindrical MIM capacitor, a buried contact is prepared on a substrate in such a configuration that a source region of the underlying access transistor is connected to the buried contact and the lower electrode of the capacitor is formed on the buried contact. Particularly, a metal silicide layer may be interposed between the buried contact and the lower electrode so as to reduce contact resistance between the lower electrode comprising metal and the buried contact comprising polysilicon.

Particularly, a mold layer is formed on the substrate in such a configuration that the buried contact is exposed through an opening and a metal layer may be formed on the mold layer and, thus, the buried contact makes contact with the metal layer. Thereafter, the metal of the metal layer and the polysilicon of the buried contact react with each other by a consecutive thermal process to thereby form a metal silicide layer on the buried contact. Then, a metal nitride layer is formed on the mold layer and the metal silicide layer and, thus, metals for a lower electrode may not penetrate into the mold layer, the metal silicide layer and the buried contact. Thereafter, the metals are formed on the metal nitride layer as the lower electrode of the capacitor.

However, when a high-temperature nitride process is performed on the metal silicide in a subsequent process, the metal silicide layer is partially agglomerated and, thus, the sheet resistance of the metal silicide layer is rapidly increased. At worst, the metal silicide layer is partially broken at the agglomeration portion and, thus, the lower electrode is electrically shorted from the buried contact. Accordingly, high sheet resistance of the metal silicide layer usually prohibits a desired operation performance of the DRAM device and eventually leads to operation failures of the memory device, which reduces manufacturing yield of the device. In addition, the increase of the sheet resistance of the metal silicide layer due to the agglomeration much more frequently occurs as the line width of the pattern of the memory device decreases.

Further, when the conventional nitride process is performed at a high temperature of about 600° C. to about 850° C., the dopants of the source/drain regions are also prevented from activating to thereby increase the channel resistance under the gate electrode of the memory device. That is, the high temperature nitride process causes the increase of the channel resistance under the gate electrode due to the inactivation of the dopants as well as the increase of the sheet resistance of the metal silicide layer on the buried contact due to the agglomeration.

Accordingly, there is still a need for an improved formation method of the metal silicide layer on the buried contact by which the metal silicide layer has a much more improved thermal stability, so that the metal silicide layer is sufficiently prevented from agglomerating and the dopants of the source/drain regions are sufficiently prevented from inactivating in a subsequent high temperature process.

SUMMARY

Example embodiments of the present inventive concept provide a method of manufacturing a semiconductor device such that the metal silicide layer interposed between the buried contact and the lower electrode of the capacitor has an improved thermal stability and thus the metal silicide layer is sufficiently prevented from agglomerating in a high temperature process.

Other example embodiments of the present inventive concept provide a semiconductor device manufactured through the above manufacturing process.

According to some example embodiments, there is provided a method of manufacturing a semiconductor device. An insulation interlayer may be formed on a substrate such that conductive structures on the substrate are covered with the insulation interlayer and a buried contact may make contact with the conductive structures through the insulation interlayer. A mold pattern may be formed on the insulation interlayer and the mold pattern may have a node hole through which the buried contact covered with a metal silicide layer may be exposed. The metal silicide layer may be formed by a first heat treatment under a first temperature and a second heat treatment under a second temperature higher than the first temperature. A cylindrical node-separated lower electrode may be formed on a sidewall of the node hole and on the metal silicide layer in the node hole of the mold pattern. The mold pattern may be removed from the insulation interlayer, thereby exposing the cylindrical lower electrode. A dielectric layer may be formed in such a way that the cylindrical lower electrode may be covered with the dielectric layer. An upper electrode may be formed on the dielectric layer.

In an example embodiment, the mold pattern may be formed as follows: A metal layer may be formed on the insulation interlayer and the buried contact. Then, the first heat treatment may be performed on the metal layer, thereby forming a preliminary metal silicide layer on the buried contact by a silicidation process between silicon of the buried contact and metal of the metal layer. Residuals of the metal layer that did not participate in the silicidation process may be removed from the insulation interlayer and then the second heat treatment may be instantaneously performed on the preliminary metal silicide layer, thereby forming a metal silicide layer on the buried contact. An etch stop layer and a mold layer may be sequentially formed on the insulation interlayer and the metal silicide layer, and then the mold layer and the etch stop layer may be sequentially and partially removed from the insulation interlayer, thereby forming the node hole penetrating through the mold layer and the etch stop layer such that the metal silicide layer may be exposed through the node hole.

In an example embodiment, the first heat treatment may include a rapid thermal process (RTP) and the second heat treatment includes a millisecond annealing (MSA) process. In such a case, the RTP process may be performed at a temperature of 250° C. to 350° C. and the MSA process may be performed for 10 nanoseconds to 5 milliseconds at a temperature of 1,000° C. to 1,400° C. The MSA process may include one of a laser annealing process and ramp type flash annealing process.

In an example embodiment, the mold pattern may be formed through the following processing steps. An etch stop layer and a mold layer may be sequentially formed on the buried contact and the insulation interlayer. Then, the mold layer and the etch stop layer may be sequentially and partially removed from the buried contact, thereby forming the node hole penetrating through the mold layer and the etch stop layer in such a way that the buried contact may be exposed through the node hole. A metal layer may be formed on a surface of the mold pattern, on a sidewall of the node hole and on a surface of the buried contact. Then, the first heat treatment may be performed on the metal layer, thereby forming a preliminary metal silicide layer on the buried contact by a silicidation process between silicon of the buried contact and metal of the metal layer. Residuals of the metal layer, which did not participate in the silicidation process, may be removed from the sidewalls of the node hole and the surface of the mold pattern. The second heat treatment may be instantaneously performed on the preliminary metal silicide layer, thereby forming a metal silicide layer on the buried contact.

In an example embodiment, the first heat treatment may include a rapid thermal process (RTP) performed at a temperature of about 250° C. to about 350° C. and the second heat treatment may include a millisecond annealing (MSA) process performed for about 10 nanoseconds to about 5 milliseconds at a temperature of about 1,000° C. to about 1,400° C.

In an example embodiment, the metal silicide layer may include one of mono nickel silicide (NiSi) and mono nickel platinum silicide ((NiPt)Si).

In an example embodiment, the formation of the cylindrical node-separated lower electrode may include a step for depositing a metal nitride layer on a sidewall of the node hole, on a surface of the metal silicide layer and on a surface of the mold pattern under a temperature of about 700° C. to about 800° C.

In an example embodiment, the formation of the cylindrical node-separated lower electrode may include a step of forming a first conductive layer on a sidewall of the node hole, on a surface of the metal silicide layer and on a surface of the mold pattern, and a step of performing a plasma nitriding process on the first conductive layer at a temperature of about 700° C. to about 1,300° C., thereby forming a nitride layer on the first conductive layer.

In an example embodiment, the formation of the cylindrical node-separated lower electrode may include a step of forming a titanium layer on a sidewall of the node hole, on a surface of the metal silicide layer and on a surface of the mold pattern, and a step of forming a titanium nitride layer on the titanium layer according to a surface profile of the mold pattern having the node hole.

According to some example embodiments, there is provided a semiconductor device including a substrate on which conductive structures are arranged, an insulation interlayer covering the conductive structures and having a buried contact penetrating therethrough such that the conductive structures may be electrically insulated from one another and the buried contact makes contact with the conductive structures, a metal silicide layer including nickel (Ni) on a whole surface of the buried contact, a cylindrical lower electrode on the metal silicide layer, a dielectric layer covering the lower electrode, and an upper electrode on the dielectric layer and having a flat upper surface.

In an example embodiment, the buried contact may comprise polysilicon and the metal silicide layer comprises one of mono nickel silicide (NiSi) and nickel platinum silicide ((NiPt)Si).

In an example embodiment, a composition ratio of platinum (Pt) in the nickel platinum silicide ((NiPt)Si) may be less than about 30 atomic percent (at %).

In an example embodiment, the lower electrode may include one of a single layer of titanium nitride and a bi-layer in which a titanium layer and a titanium nitride layer are stacked.

According to some example embodiments, there is provided another method of manufacturing a semiconductor device. A buried contact may be formed on a substrate and a metal silicide layer may be formed on the buried contact. In such a case, the metal silicide layer may be formed through a first heat treatment at a first temperature and a second heat treatment at a second temperature greater than the first temperature. The second heat treatment may be performed locally at the interface of the metal silicide layer with the buried contact.

In an example embodiment, the first heat treatment comprises a rapid thermal process (RTP) and the second heat treatment comprises a millisecond annealing process (MSA).

In an example embodiment, the RTP process is performed at a temperature of about 250° C. to about 350° C. and the MSA process is performed for about 10 nanoseconds to about 5 milliseconds at a temperature of about 1,000° C. to about 1,400° C.

In an example embodiment, the MSA process comprises one of a laser annealing process and a ramp type flash annealing process.

In an example embodiment, the metal silicide layer comprises one of mono nickel silicide (NiSi) and mono nickel platinum silicide ((NiPt)Si).

According to example embodiments of the present inventive concept, the metal silicide layer interposed between the lower electrode and the storage node contact plug as an ohmic layer may be formed by consecutive relatively low temperature heat treatment and relatively high temperature heat treatment, to thereby sufficiently improve thermal stability of the ohmic layer. Particularly, the high temperature heat treatment may include an MSA process that may be instantaneously and locally performed just merely at the metal silicide layer. The instantaneous melting of the MSA process and the re-crystallization of the metal and silicon after completing the MSA process may sufficiently stabilize the bonding structure of the metal silicide layer.

BRIEF DESCRIPTION OF THE DRAWINGS

Example embodiments will be more clearly understood from the following detailed description taken in conjunction with the accompanying drawings.

FIGS. 2A to 2L are cross-sectional views illustrating processing steps for a method of manufacturing the semiconductor device shown in FIG. 1;

DETAILED DESCRIPTION OF THE EMBODIMENTS

Figure 1:
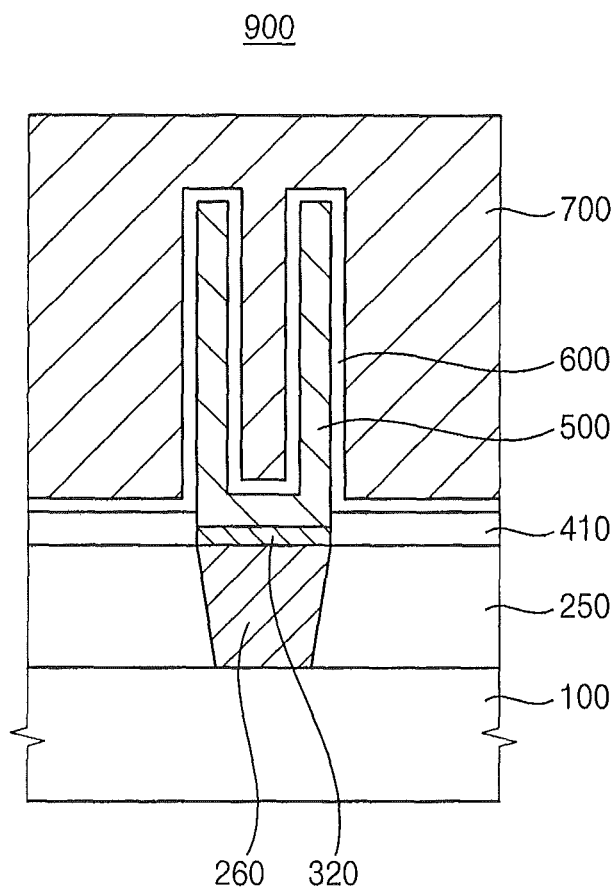
FIG. 1 is a cross-sectional view illustrating a semiconductor device in accordance with an example embodiment of the present inventive concept.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout the description. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, example embodiments will be explained in detail with reference to the accompanying drawings.

Semiconductor Device

FIG. 1 is a cross-sectional view illustrating a semiconductor device in accordance with an example embodiment of the present inventive concept. In the present example embodiment, a cylindrical capacitor of a DRAM device may be connected to a storage node contact plug in a medium of an ohmic layer comprising metal silicide. However, the present inventive concept may also be applied to other memory devices in which a capacitor is connected to a conductive structure underlying the capacitor in a medium of the ohmic layer comprising metal silicide.

Referring to FIG. 1, a semiconductor device 900 in accordance with an example embodiment of the present inventive concept may include a substrate 100 including various conductive structures thereon, an insulation interlayer 250 covering the conductive structures and including a penetrated buried contact 260 making contact with the conductive structures, an ohmic layer 320 on the buried contact 260 and comprising a metal including nickel (Ni), a cylindrical lower electrode 500 on the ohmic layer 320, a dielectric layer 600 on the lower electrode 500 in accordance with a profile of the lower electrode 500, and an upper electrode covering the dielectric layer 600 and having a flat top surface.

For example, the substrate 100 may include a semiconductor substrate, such as a silicon wafer and may include an active region in which the conductive structures may be arranged and a field region defining the active region.

For example, the conductive structure may include a transistor having a gate structure and source/drain areas at sides of the gate structure that may be arranged in the active region of the substrate 100. Some dopants may be implanted onto the source/drain areas of the transistor. Further, the conductive structure may include a bit line contact making contact with the drain area of the transistor, a bit line making contact with the bit line contact, and a storage node contact pad making contact with the source area of the transistor. The transistor, the bit line contact, the storage node contact pad and the bit line may be electrically insulated from one another by a plurality of insulation layers.

For example, the insulation interlayer 250 may be formed on the substrate 100 in such a configuration that the conductive structures may be covered with the insulation interlayer 250 and have a flat top surface. Hereinafter, the conductive structure under the insulation layer 250 may be sometimes called an underlying structure because the conductive structure may be positioned under the insulation interlayer 250. In addition, the insulation interlayer 250 may further include an opening through which the underlying structure may be exposed.

For example, the buried contact 260 may be positioned in the opening of the insulation interlayer 250 and, thus, may make contact with the underlying conductive structure. In the present example embodiment, the buried contact 260 may make contact with the storage node contact pad in the opening of the insulation interlayer 250. The buried contact 260 may comprise polysilicon doped with impurities, such as arsenic (As) and phosphorus (P). An upper surface of the buried contact 260 may be coplanar with an upper surface of the insulation interlayer 250.

The ohmic layer 320 may be positioned on the buried contact 260 and comprise a metal silicide caused by chemical reactions between silicon of the buried contact 260 and a metal. Particularly, the ohmic layer 320 may be formed through a first heat treatment under a relatively lower temperature and a second heat treatment under a relatively higher temperature and, thus, may have an anti-thermal structure that may be sufficiently stable in high temperature environments. The second heat treatment may be locally performed at the interface between the buried contact 260 and the metal silicide at an instant time.

For example, the ohmic layer 320 may comprise nickel silicide (NiSi) or nickel platinum silicide (NiPtSi). Nickel silicide may have a specific resistance lower than the conventional platinum silicide and cobalt silicide. In addition, nickel silicide may need relatively small silicon in a silicidation process, and, thus, the agglomeration of the nickel silicide may be reduced or minimized under high temperature conditions. Therefore, the increase of the sheet resistance of the ohmic layer 320 caused by the agglomeration may be sufficiently prevented and, thus, the ohmic layer 320 may have a sufficiently low electrical resistance between the buried contact 260 and the lower electrode 500.

Particularly, the nickel (platinum) silicide of the ohmic layer 320 may be formed through an instantaneous melting by a millisecond annealing process and an immediate re-crystallization and, thus, may have a thermally-stable crystal structure. Accordingly, the thermal vulnerability of the metal silicide may be sufficiently improved to thereby reduce or prevent the deterioration of the contact resistance between the buried contact and the lower electrode.

An etch stop layer 410 may be provided on the insulation interlayer 250 and the underlying conductive structures may be protected from the process for forming the lower electrode 500. For example, the etch stop layer 410 may comprise silicon nitride (SiN).

The lower electrode 500 may be shaped into a cylinder and may include a metal layer and a metal nitride layer. The lower electrode 500 may be connected to the buried contact 260 in a medium of the ohmic layer 320. Therefore, the lower electrode 500 may be electrically connected to the source area of the transistor through the storage node contact pad and the buried contact 260. In the present example embodiment, the lower electrode 500 may include a single layer of titanium nitride (TiN) or a bi-layer having a titanium layer and a titanium nitride layer.

The dielectric layer 600 may include a material layer having a material of high dielectric constant (high dielectric material) and an oxide layer on the high dielectric material. In other embodiments, the dielectric layer 600 may include a multi layer in which a first oxide layer, a nitride layer, and a second oxide layer may be sequentially stacked. The upper electrode 700 may include a metal layer just like the lower electrode 500. Thus, the lower electrode 500, the dielectric layer 600, and the upper electrode 700 may be formed into a MIM capacitor.

According to the semiconductor device of an example embodiment of the present inventive concept, the ohmic layer interposed between the buried contact and the lower electrode may comprise sufficiently thermo-stable nickel silicide or nickel platinum silicide. Thus, the agglomeration of the ohmic layer may be sufficiently reduced or prevented and, thus, the sheet resistance of the ohmic layer may be kept to be sufficiently small. As a result, the contact resistance between the buried contact and the lower electrode may be reduced or minimized in the semiconductor device, thereby increasing the operation speed of the semiconductor device.

Method of Manufacturing a Semiconductor Device

FIGS. 2A to 2I are cross-sectional views illustrating processing steps for a method of manufacturing the semiconductor device shown in FIG. 1 according to example embodiments of the inventive concept. FIGS. 2A to 2I are cross-sectional views cut along the bit line of the semiconductor device shown in FIG. 1.

Figure 2A:
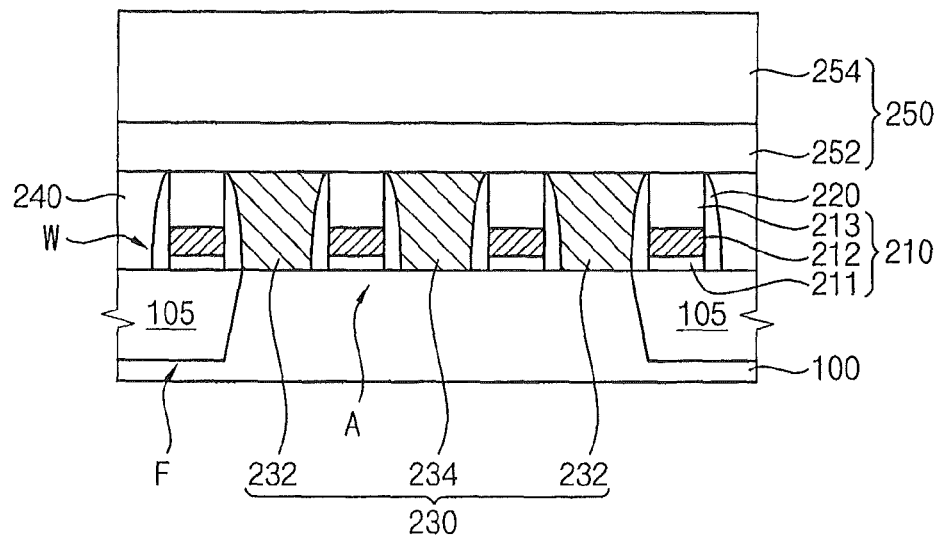

Referring to FIG. 2A, the underlying conductive structures, such as the gate structures 210, may be formed on the substrate 100 and the insulation interlayer 250 may be formed on the substrate 100 in such way that the conductive structures may be electrically insulated from one another.

For example, the substrate 100 may include a semiconductor substrate, such as a silicon wafer, and may include an active region A in which the conductive structures may be formed and a field region F defining the active region A. A device isolation layer 105 may be formed in the field region F by a device isolation process, such as a shallow-trench isolation (STI) process.

A gate oxide pattern 211 and a gate conductive pattern 212 may be stacked on the active region A of the substrate 100 and a spacer pattern 220 may be formed on sidewalls of the gate oxide pattern 211 and the gate conductive pattern 212, thereby forming the gate structure 210 on the substrate 100. A gate mask pattern 213 may be selectively formed on the gate conductive pattern 212. A plurality of the gate structures 210 may be arranged in series along a first direction and then may function as a word line W for a memory device, for example a DRAM device. Neighboring gate structures 210 adjacent to each other in a second direction substantially perpendicular to the first direction may be electrically insulated from each other by the spacer pattern 220. The active region A of the substrate 100 may be partially exposed through the neighboring word lines W and dopants may be implanted onto the exposed active region A, to thereby form the source/drain junction areas around the gate structure 210.

Accordingly, a metal oxide semiconductor (MOS) transistor including the gate structure 210 and the source/drain junction areas may be formed on the substrate 100. The source area may make electrical contact with a storage electrode (lower electrode) of a capacitor of the memory device and the drain area may make electrical contact with a bit line of the memory device.

Then, an insulation layer 240 may be formed on the substrate 100 in such a way that gap spaces between the gate structures 210 may be filled with the insulation layer 240. A storage node contact pad 232 and a bit line contact pad 234 may be formed on the source and drain areas of the substrate through the insulation layer 240 simultaneously with each other. An upper surface of the insulation layer 240 and upper surfaces of the storage node contact pad 232 and the bit line contact pad 234 may be coplanar with one another.

A lower insulation interlayer 252 may be formed on the insulation layer 240, the storage node contact pad 232, and the bit line contact pad 234 and a bit line contact hole may be formed in the lower insulation interlayer 252. The bit line contact pad 234 may be exposed through the bit line contact hole. A bit line contact plug may be formed in the bit line contact hole through the lower insulation interlayer 252 and a bit line may be formed on the lower insulation interlayer 252 in such a way that the bit line contact plug may make contact with the bit line.

An upper insulation interlayer 254 may be formed on the lower insulation interlayer 252 in such a way that a number of the bit lines may be electrically insulated from one another and an upper surface thereof may be planarized into a flat surface. Thus, the insulation interlayer 250 including the lower insulation interlayer 252 and the upper insulation interlayer 254 may be formed on a whole surface of the substrate 100. Thus, various conductive structures, such as the bit lines, the bit line contact plugs making contact with the bit lines, the bit line contact pads 234 making contact with the bit line contact plugs, and gate structures 210 may be formed under the insulation interlayer 250.

In the present example embodiment, the lower insulation interlayer 252 and the upper insulation interlayer 254 may include boron phosphor silicate glass (BPSG), undoped silicate glass (USG), an oxide deposited by high plasma density chemical vapor deposition (HDP CVD) or a CVD process.

Figure 2B:
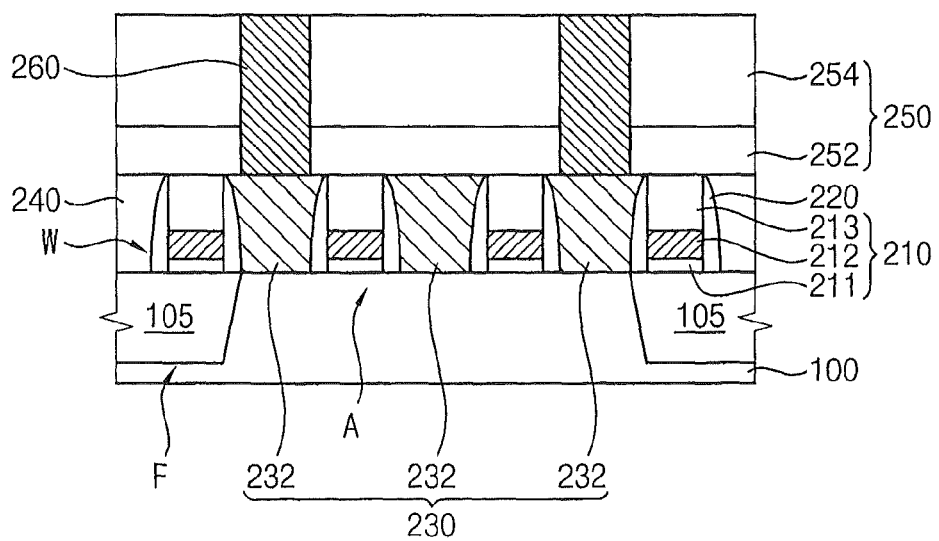

Referring to FIG. 2B, the upper insulation interlayer 254 and the lower insulation interlayer 252 may be sequentially and partially removed from the substrate 100 by a photolithography process, to thereby form a storage node contact hole through which the storage node contact pad 232 may be exposed between the neighboring word lines W.

A conductive layer may be formed on the insulation interlayer 250 to a sufficient thickness to fill up the storage node contact hole. Then, the conductive layer may be partially removed from the insulation interlayer 250 by a planarization process, until an upper surface of the insulation interlayer 250 may be exposed. Thus, the conductive layer may remain just merely in the storage node contact hole, to thereby form the buried contact 260 in the storage node contact hole. Therefore, the buried contact 260 may make contact with the storage node contact pad 232 through the insulation interlayer 250 and an upper surface of the buried contact 260 may be coplanar with the upper surface of the insulation interlayer 250.

Particularly, the conductive layer may comprise the same or like materials as the storage node contact pad 232, to thereby reduce or minimize the contact resistance between the buried contact 260 and the storage node contact pad 232. For example, the buried contact 260 may comprise polysilicon doped with arsenic (As) or phosphorus (P).

Figure 2C:
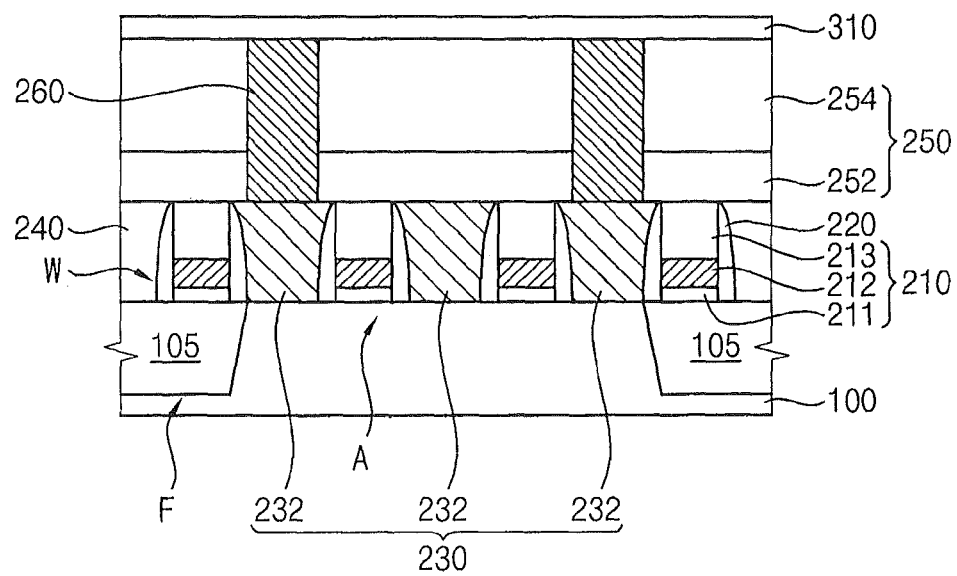

Referring to FIG. 2C, a metal layer 310 may be formed on the insulation interlayer 250 and the buried contact 260 so as to form a metal silicide on the buried contact 260.

For example, the metal layer 310 may comprise a low resistance metal and may be formed by a deposition process, such as a physical vapor deposition (PVD) process, a chemical vapor deposition (CVD) process, an atomic layer deposition (ALD) process, a plasma enhanced CVD (PECVD) process, and a cyclic CVD process. Examples of the low resistance metal may include nickel (Ni), platinum (Pt), titanium (Ti), ruthenium (Ru), rhodium (Rh), cobalt (Co), hafnium (Hf), tantalum (Ta), erbium (Er), ytterbium (Yb), tungsten (W), etc. These may be used alone or in combinations thereof.

In the present example embodiment, the metal layer 310 may comprise nickel (Ni) in view of lower electrical resistance and lower consumption of silicon in a high temperature silicidation process.

For example, the metal layer 310 may comprise nickel (Ni) and an alloy of nickel (Ni) and platinum (Pt). Because the contact resistance of the ohmic layer 320 with the buried contact 260 may be proportional to the composition ratio of impurity material combined with nickel (Ni) when the metal layer 310 includes a nickel (Ni) alloy, the composition ratio of the impurity material may be controlled in view of the contact resistance of the ohmic layer 320. In the present example embodiment, the composition ratio of platinum (Pt) in the nickel-platinum (Ni—Pt) alloy may be controlled to be under about 30 atomic percent (at %).

Particularly, the metal layer 310 may be formed to such a sufficient thickness that metal atoms may be sufficiently provided in the silicidation process with the buried contact 260 for a desired time, and, thus, a metal silicide layer may be formed to a sufficient thickness on the buried contact 260. When the metal layer 310 may have an insufficiently small thickness, the metal silicide layer may be formed on the buried contact 260 to an insufficient thickness or may need an excessively long process time for forming the metal silicide layer. In contrast, when the first metal layer 310 may have an unnecessarily large thickness, a large portion of the metal layer 310 may not participate in the silicidation process and, thus, may be finally removed from the insulation interlayer 250, to thereby increase the manufacturing cost of the memory device.

Figure 2D:
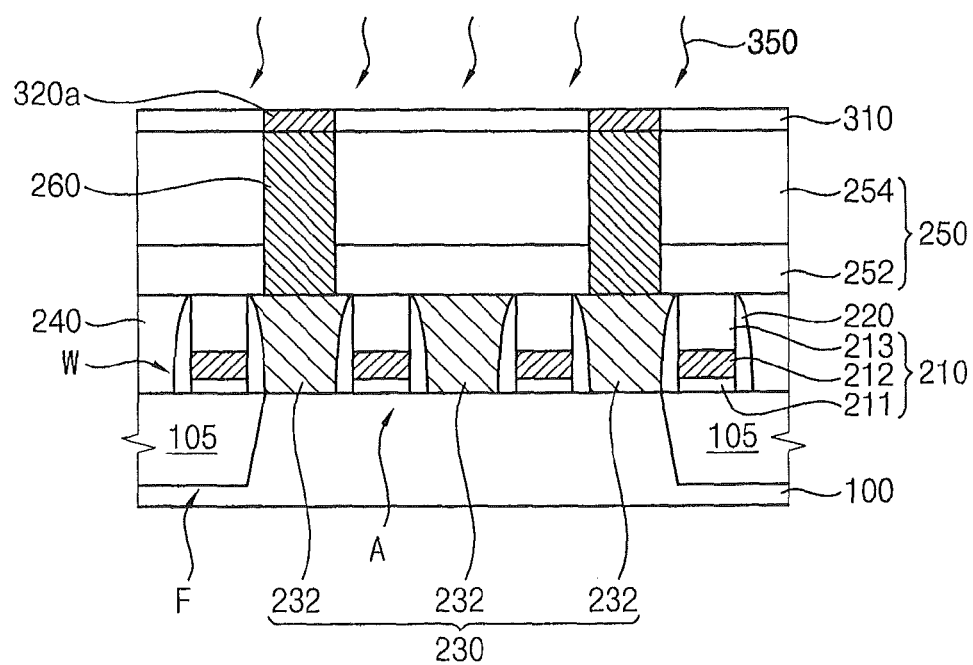

Referring to FIG. 2D, a first heat treatment 350 may be performed to the metal layer 310 at a first temperature, to thereby transform a portion of the metal layer 310 making contact with the buried contact 260 into a preliminary metal silicide layer 320a. The first temperature may be relatively lower than a second temperature of a subsequent second heat treatment.

Because the first heat treatment 350 may be performed at a relatively lower temperature than the subsequent second heat treatment, the metal component may be richer than the silicon component as a result of the silicidation process and, thus, the preliminary metal silicide layer 320a may be formed into a metal-rich metal silicide layer. That is, the atomic ratio of metal and silicon may be over about 1 in the preliminary metal silicide layer 320a. For example, the first heat treatment may include a rapid thermal process (RTP) under the first temperature of about 250° C. to about 350° C.

Due to the first heat treatment 350, silicon (Si) atoms of the buried contact 260 may react with metal atoms of the metal layer 310 and, thus, the preliminary metal silicide layer 320a may be formed on the buried contact 260. Because the first heat treatment may be rapidly performed at a relatively low temperature, the preliminary metal silicide layer 320a may be formed in such a composition that metal may be richer than silicon (Si) in view of the composition ratio. In case that the metal layer 310 may comprise nickel (Ni) or nickel-platinum (Ni—Pt) alloy, the preliminary metal silicide layer 320a may comprise dinickel silicide (Ni2Si) or dinickel platinum silicide (NiPt)2Si).

Figure 2E:
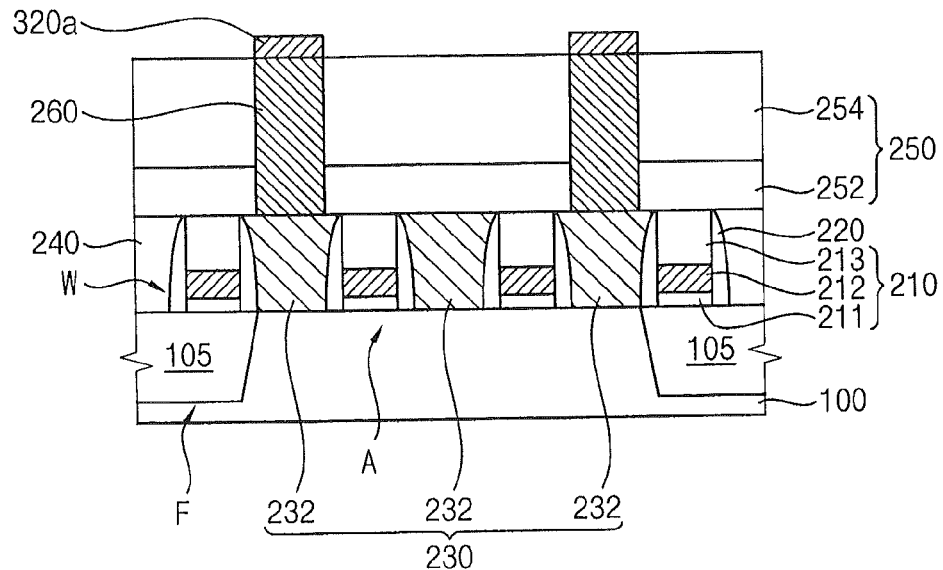

Referring to FIG. 2E, residuals of the metal layer 310 that may not react with silicon (Si) in the silicidation process may be removed from the insulation interlayer 250 by an etching process, and, thus, the preliminary metal silicide layer 320a may remain on the buried contact 260. The etching process may include a dry etching process by which just metal atoms may be selectively removed from the insulation interlayer 250.

For example, a metal chloride (MClx) of the metal of the metal layer 310 may be provided with the substrate 100 selectively together with inactive gases such as argon (Ar) and nitrogen (N2) gases. The metal chloride may be reacted with the metal of the residuals of the metal layer 310 as described in the following chemical equation (1), thereby removing the residuals of the metal layer 310 from the insulation interlayer 250.

$$M+MClx \rightarrow MCly \; (x,y: \text{integer}) \quad (1)$$

Because the reaction rate of the chemical equation (1) may be varied by a flow rate and a flow time of the metal chloride and a substrate temperature, the flow rate and flow time of the metal chloride may be controlled in such a way that the residuals of the metal layer 310 may be removed from the insulation interlayer 250 at a proper speed.

Figure 2F:
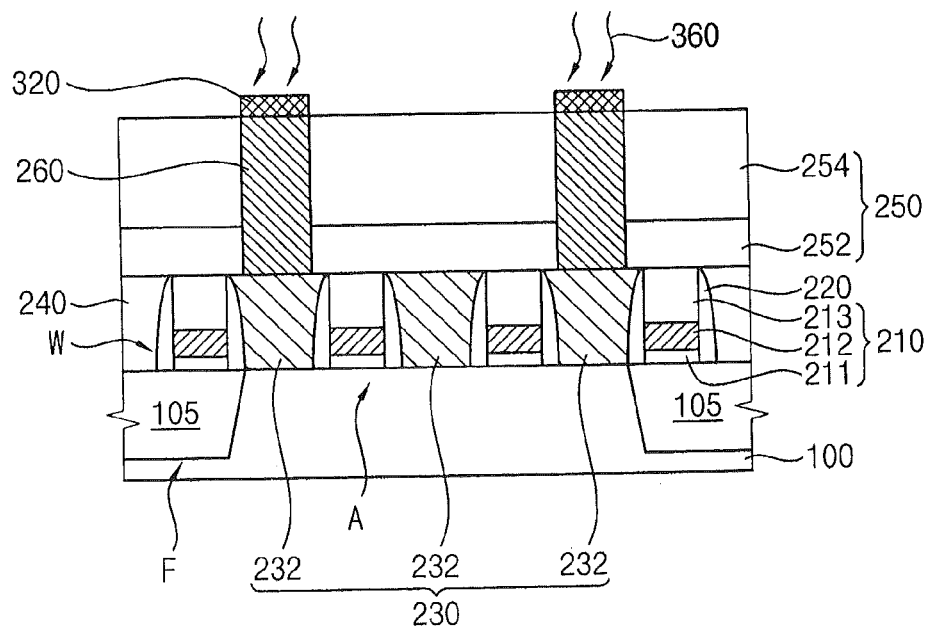

Referring to FIG. 2F, the second heat treatment 360 may be performed on the preliminary metal silicide 320a at the second temperature higher than the first temperature, to thereby form a thermo-stable metal silicide 320 on the buried contact 260. Particularly, the second heat treatment 360 may be instantaneously performed for an ultimately short time just to the preliminary metal silicide layer 320a.

For example, the second heat treatment 360 may include a millisecond annealing (MSA) process by using a laser annealing tool or a flash annealing tool. Particularly, the second heat treatment 360 may be selectively performed just to the preliminary metal silicide 320a without thermal influence on the insulation interlayer 250, only the preliminary metal silicide 320a may be instantaneously melted by heat.

In the present example embodiment, the MSA process may be performed at the second temperature of about 1,000° C. to about 1,500° C. for about 10 nanoseconds to about 5 milliseconds in a process chamber under an ambient temperature of about 300° C. to about 400° C.

After completing the instantaneous MSA process, the composition of the preliminary metal silicide may be re-crystallized into a silicon-rich composition from the metal-rich composition under the instantaneous melting state. The energy level of the chemical bonding between metal and silicon in the metal-rich metal silicide may be lowered when the metal silicide may be melted, and, thus, the re-crystallization after the MSA process may stabilize the chemical bonding of the metal silicide 320. That is, the preliminary metal silicide layer 320a may be formed into the thermo-stable metal silicide layer 320 by the MSA process.

Therefore, the thermo-stable metal silicide layer 320 may be formed on the buried contact 260 by the second heat treatment 360. Because the chemical bonding between metal and silicon (Si) may have a low energy level and, thus, may be sufficiently stable in the metal silicide layer 320, the agglomeration and void may be scarcely found in the metal silicide layer 320.

In the above-described metal silicide layer 320, the composition ratio of silicon (Si) may be equal to or greater than that of metal, and, thus, the metal silicide layer 320 may have a silicon-rich metal silicide structure. In addition, the metal silicide layer 320 may have a crystal structure similar to a single crystal structure due to an epitaxial process. Accordingly, the metal silicide layer 320 may not be influenced by heat in a subsequent high temperature process higher than about 700° C. and, thus, no structural changes such, as agglomeration may be found in the metal silicide layer 320. As a result, the metal silicide layer 320 may maintain the original morphology in spite of the subsequent high temperature process.

For example, when the metal layer 310 may include nickel (Ni) or nickel-platinum (Ni—Pt) alloy, the metal silicide layer 320 may include mono nickel silicide (NiSi) or mono nickel-platinum silicide ((NiPt)Si).

Particularly, because the second heat treatment 360 may be instantaneously performed just on the preliminary metal silicide layer 320a, the heat in the second heat treatment 360 may have substantially no effect on the word line W and a peripheral region of the substrate 100 underlying the insulation interlayer 250. As a result, the impurities of the junction area may be sufficiently reduced or prevented from agglomerating around the word line W and the peripheral region in spite of the high temperature second heat treatment 360.

Figure 2G:
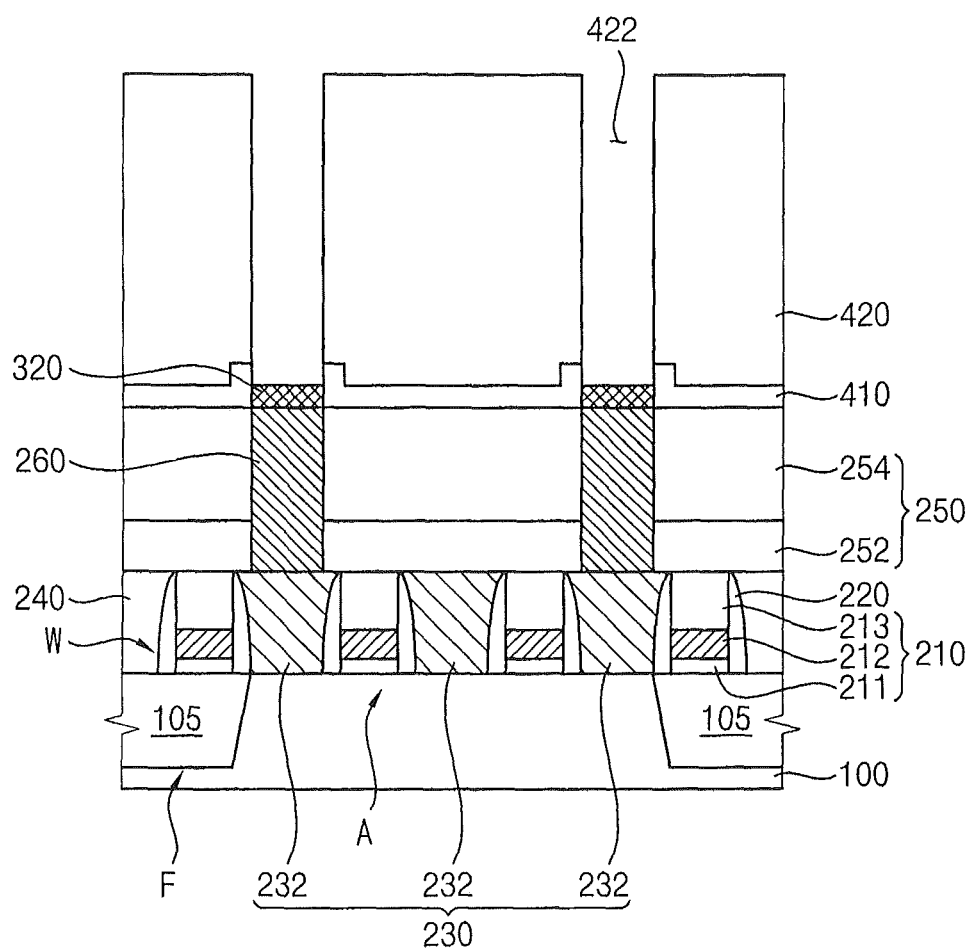

Referring to FIG. 2G, a mold pattern 420 and an etch stop pattern 410 through which a node hole 422 may be extended may be formed on the insulation interlayer 250 in such a way that the metal silicide layer 320 may be exposed through the node hole 422.

For example, an etch stop layer may be formed on the metal silicide layer 320 and the insulation interlayer 250 and a mold layer may be formed on the etch stop layer. The mold layer may function as a mold for a capacitor of a DRAM device. Thus, the mold layer may be formed to a thickness corresponding to a length of a lower electrode of the cylindrical capacitor.

The mold layer may have etching selectivity with respect to the etch stop layer and, thus, the mold layer may be etched off from the insulation interlayer 250 without etching to the etch stop layer. For example, the etch stop layer may comprise silicon nitride and silicon oxynitride and the mold layer may comprise an oxide such as PETEOS, BPSG and PSG.

Then, a photoresist pattern may be formed on the mold layer and the mold layer and the etch stop layer may be subsequently removed from the insulation interlayer 250 by an etching process using the photoresist pattern as an etching mask, thereby forming the mold pattern 420 and an etch stop pattern 410. The node hole 422 may extend through the mold pattern 420 and the etch stop pattern 410 and the metal silicide layer 320 may be exposed through the node hole 422.

Particularly, the etching process against the mold layer may be terminated at a time when the etch stop layer may be exposed, and, thus, the underlying structures under the mold layer may be sufficiently prevented from being etched off from the substrate 100. Thereafter, the etch stop layer exposed through the mold pattern 420 may be additionally etched off from the insulation interlayer 250, thereby forming the etch stop pattern 410 through which the metal silicide layer 320 may be exposed.

Accordingly, the etch stop pattern 410 and the mold pattern 420 may be formed on the insulation interlayer pattern 250 and the metal silicide layer 320 may be exposed through the node hole 422.

Then, a plasma nitriding process may be optionally performed on the exposed metal silicide layer 320 using nitrogen-based source gases such as ammonium (NH3) gases and nitrogen (N2) gases. As a result, the metal silicide layer 320 may be covered with a nitride layer that may function as an anti-diffusion layer for preventing diffusion of oxygen into the metal silicide layer 320.

Further, a wet cleaning process may also be optionally performed on the exposed metal silicide layer 320, thereby removing a native oxide layer from the surface of the metal silicide layer 320. For example, the wet cleaning process may be performed by an etchant including an aqueous hydrogen fluoride (HF) solution.

Figure 2H:
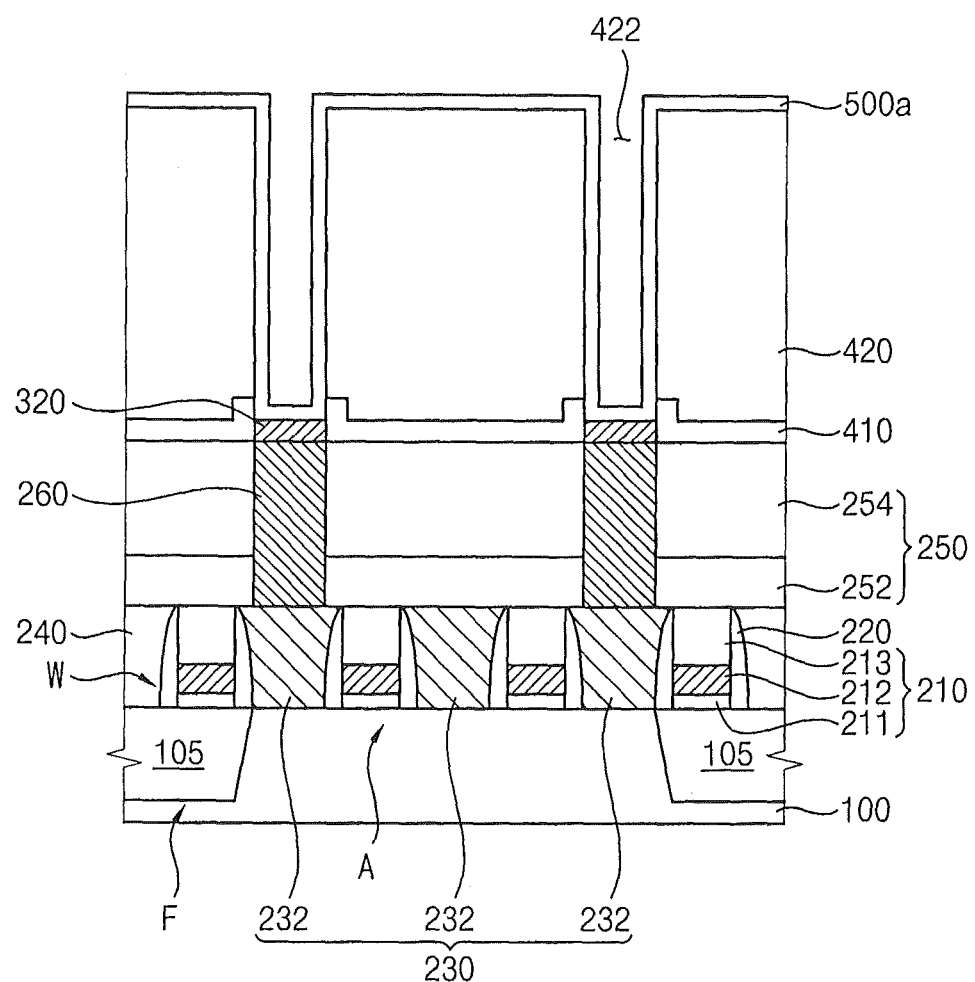
Figure 21:
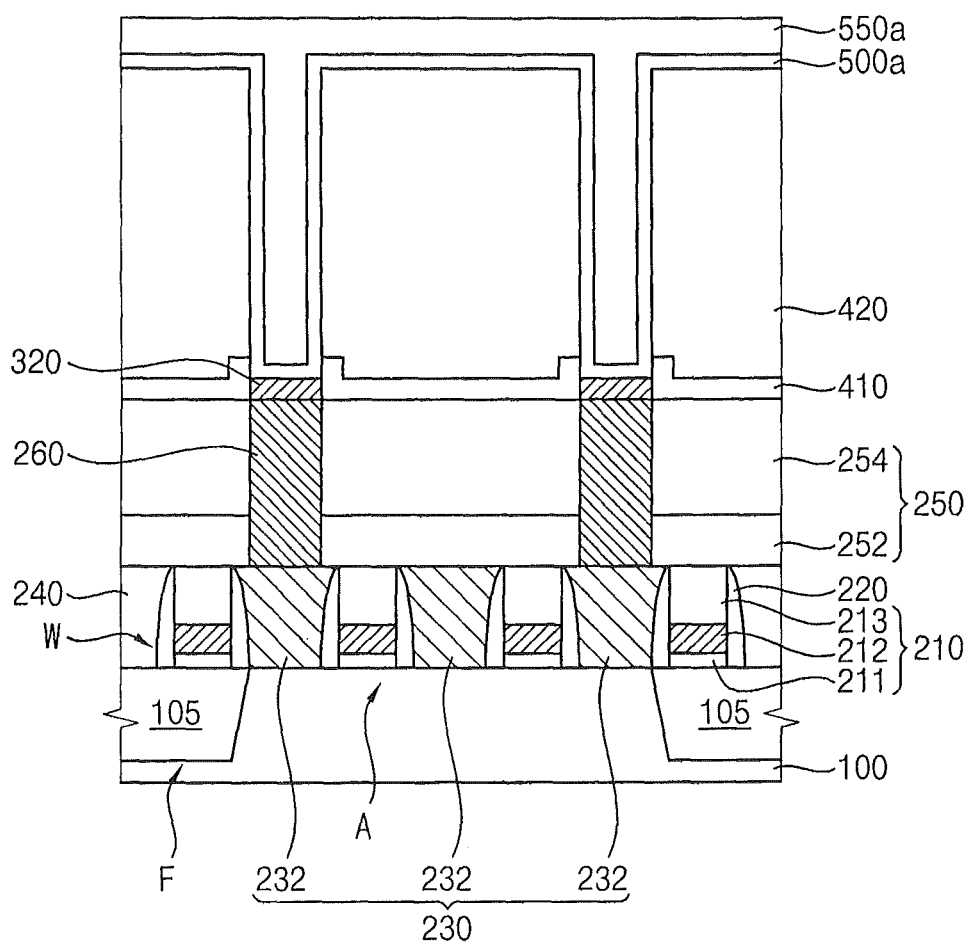

Referring to FIG. 2H, a first conductive layer 500a may be formed on the mold pattern 420 according to a profile of the node hole 422. The first conductive layer 500a may comprise a material having high electrical conductance. Examples of the high conductive material may include a noble metal, such as platinum (Pt), ruthenium (Ru), iridium (Ir), a conductive oxide of the noble metal, a refractory metal, such as titanium (Ti), tungsten (W), tantalum (Ta), and a conductive nitride of the refractory metal. These materials may be used alone or in combinations thereof. The first conductive layer 500a may include a single layer of the high conductive material or a multi layer in which at least two layers of the single layers may be stacked.

In the present example embodiment, the first conductive layer 500a may include a single layer of metal nitride deposited by one of a CVD process, an ALD process, a PECVD process and a cyclic CVD process.

For example, the substrate 100 including the mold pattern 420 may be loaded into a process chamber under a temperature of about 700° C. to about 800° C. and a pressure of about 2 Torr to about 5 Torr, and source gases including TiCl4 and NH3 together with inert gases such as nitrogen (N2) gases. As a result, a titanium nitride (TiN) layer may be formed on the mold pattern 420 as the first conducive layer 500a. Otherwise, a titanium layer may be formed on the mold pattern 420 and then a plasma nitriding process may be performed on the titanium layer using nitrogen-based gases, such as ammonium (NH3) gases and nitrogen (N2) gases at a temperature of about 700° C. to about 1,300° C., thereby forming the titanium nitride layer on the mold pattern 420 as the first conductive layer 500a. In such a case, the plasma nitriding process may be performed for a time of about 1 nanosecond to about 120 milliseconds. The titanium nitride layer by the plasma nitriding process may have a nitrogen (N) component much more fluently than the titanium nitride layer by the deposition process and may have a crystal structure different from the titanium nitride layer by the deposition process.

In such a case, because the metal silicide layer 320 functioning as an ohmic layer may have a thermo-stable structure by the MSA process, no or reduced agglomeration may occur on the surface of the metal silicide layer 320 in the high temperature process for forming the first conductive layer 500a. Accordingly, an increase in the sheet resistance of the ohmic layer may be reduced or prevented in spite of the high temperature process for forming the lower electrode of the capacitor.

In a modified example embodiment, the first conductive layer 500a may include a bi-layer in which a metal layer and a metal nitride layer may be stacked. The metal layer may be formed on the mold pattern 420 by one of a CVD process, an ALD process, a PECVD process and a cyclic CVD process. In the present example embodiment, a metal layer may be formed on the mold pattern 420 and a metal nitride layer may be formed on the metal layer by the CVD process. The metal nitride layer may comprise nitride of the metal component of the metal layer.

For example, the first conductive layer 500a may include the bi-layer including a titanium layer and a titanium nitride layer. Because the titanium layer may have a crystal structure different from that of the titanium nitride layer, the etchant for etching off the mold pattern or a sacrificial oxide layer in a subsequent process may be sufficiently blocked from penetrating into the underlying structures by the titanium layer.

Referring to FIG. 2I, a sacrificial layer 550a may be formed on the first conductive layer 500a to a sufficient thickness to fill up the node hole 422.

The sacrificial layer 550a may have an etching rate substantially equal to or greater than that of the mold pattern 420, and, thus, the sacrificial layer 550a may be removed simultaneously with the mold pattern in a subsequent process. For example, the sacrificial layer 550a may comprise an oxide, such as PETEOS, BPSG and PSG similar to the mold pattern 420.

Figure 2J:
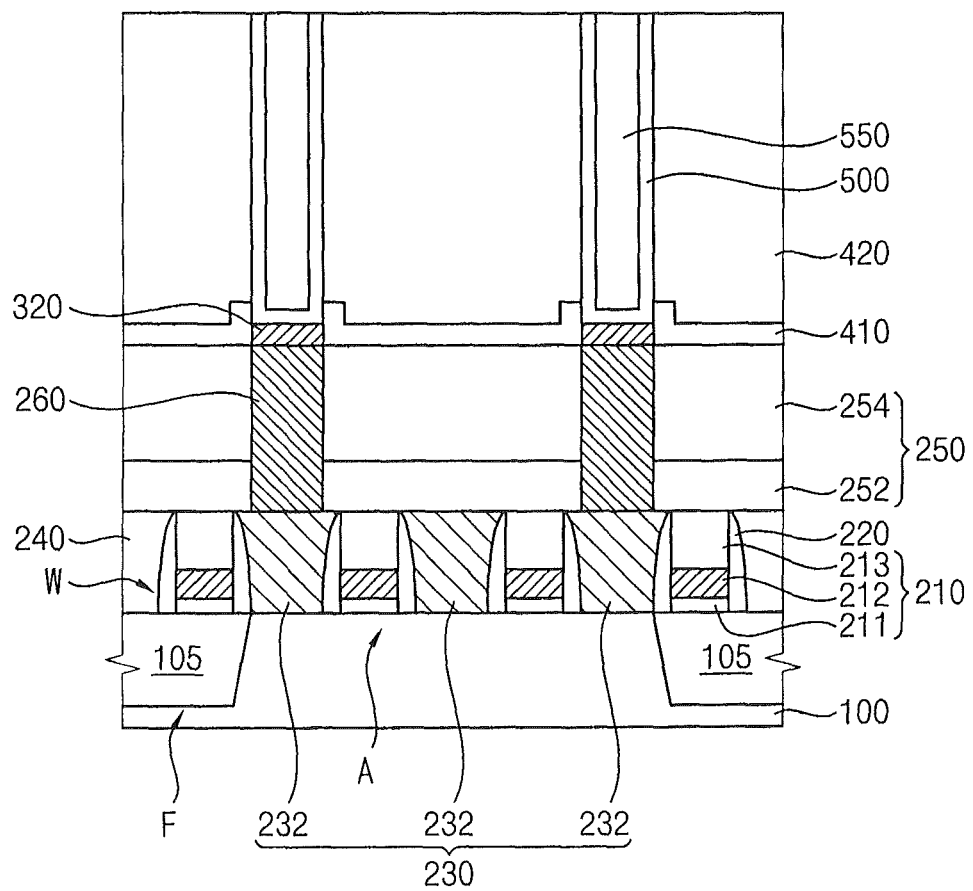

Referring to FIG. 2J, the sacrificial layer 550a and the first conductive layer 500a may be sequentially planarized by a planarization process until an upper surface of the mold pattern 420 may be exposed. Thus, the sacrificial layer 550a and the first conductive layer 500a may remain only in the node hole 422 of the mold pattern 420, to thereby form a sacrificial pattern 550 and a lower electrode 500 in the node hole 422. That is, the first conductive layer 500a may be separated into the lower electrode 500 by a cell unit, which is sometimes called a node-separated lower electrode. Hereinafter, the node-separation of the lower electrode denotes the separation of the continuous first conductive layer 500a by a unit of the cell node. For example, the planarization process may include a chemical mechanical polishing (CMP) process.

In other embodiments, the first conductive layer 500a may be planarized by an etch-back process until the upper surface of the mold pattern 420 may be exposed. Thus, the first conductive layer 500a may remain in the node hole 422, to thereby form the lower electrode 500 in the node hole 422 without the above sacrificial layer.

Figure 2K:
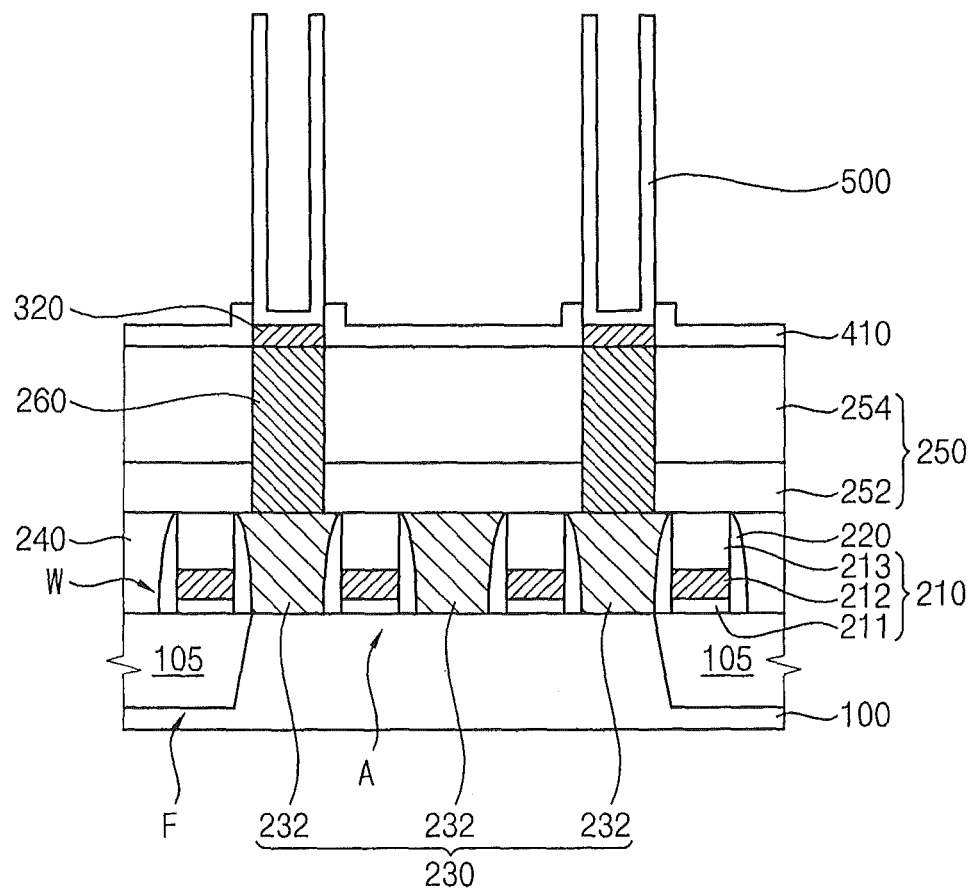

Referring to FIG. 2K, the sacrificial pattern 550 and the mold pattern 420 may be removed by a wet etching process, to thereby expose the lower electrode 500.

For example, the wet etching process for removing the sacrificial pattern 550 and the mold pattern 420 may be performed by using a buffered oxide etchant (BOE) or an aqueous HF solution as an etchant.

Thereafter, a heat treatment may be additionally performed on the exposed lower electrode 500. The additional heat treatment may be performed in a furnace at a temperature of about 550° C. to about 650° C. without any gases or together with inert gases, such as nitrogen (N2) gases and argon (Ar) gases. In such a case, ammonium (NH3) gases may be supplied to the lower electrode 500 to thereby remove impurities from the lower electrode 500 and release thermal stresses of the nitride layer of the lower electrode 550.

In such a case, the metal silicide layer 320 may be sufficiently prevented from being agglomerated in the above additional heat treatment, to thereby reduce or prevent the increase of the sheet resistance of the ohmic layer between the buried contact 260 and the lower electrode 500.

Figure 2L:
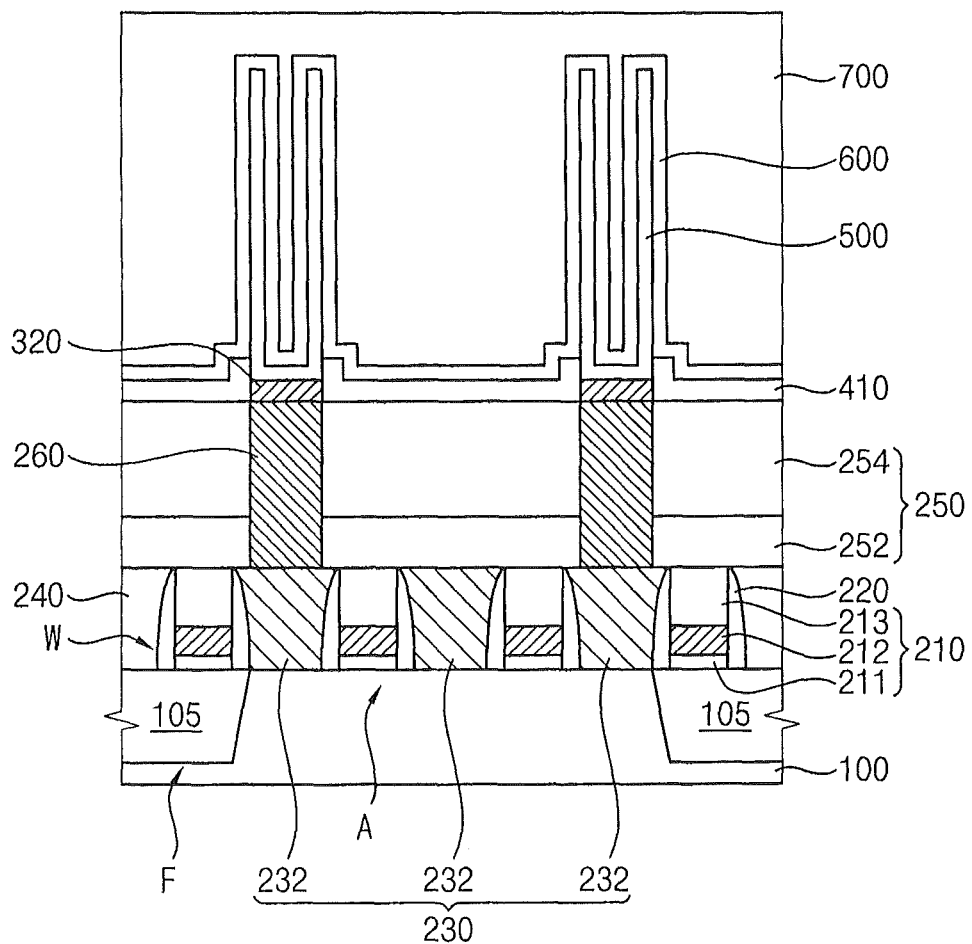

Referring to FIG. 2L, a dielectric layer 600 may be formed on the etch stop pattern 410 and the lower electrode 500 according to the profile of the cylindrical shape of the lower electrode 500 and a second conductive layer 700 may be formed on the dielectric layer 600 to a sufficient thickness to fill up intra-gap spaces of the lower electrode 500 and inter-gap spaces between the lower electrodes 500, to thereby form a capacitor of the DRAM device. The second conductive layer 700 may be formed to face the lower electrode in a medium of the dielectric layer 600, to thereby function as an upper electrode of the capacitor.

Thereafter, an upper insulation interlayer may be formed on the upper electrode of the capacitor and wiring structures may be formed on the upper insulation interlayer in such a way that the wiring structures may penetrate through the upper insulation interlayer and may make contact with underlying structures under the upper insulation interlayer. Finally, a passivation layer covering the wiring structures may be formed on the upper insulation interlayer, to thereby form the semiconductor device such as the DRAM device.

FIGS. 3A to 3D are cross-sectional views illustrating processing steps for a method of forming the semiconductor device shown in FIG. 1 in accordance with another example embodiment of the present inventive concept. In the present example embodiment, the processing steps are the same as those described with reference to FIGS. 2A to 2L except that the mold pattern is formed prior to the metal silicide layer. Thus, in FIGS. 3A to 3D, the same reference numerals denote the same elements in FIGS. 2A to 2L and the same elements have the same structure and function. For those reasons, the processing step for forming the metal silicide layer will be intensively described hereinafter.

At first, the insulation interlayer 250 may be formed on the substrate 100 and the buried contact may be formed in the insulation interlayer 250, such that the buried contact may make contact with the storage node contact pad 232 by the same process as described in detail with reference to FIGS. 2A to 2B.

Figure 3A:
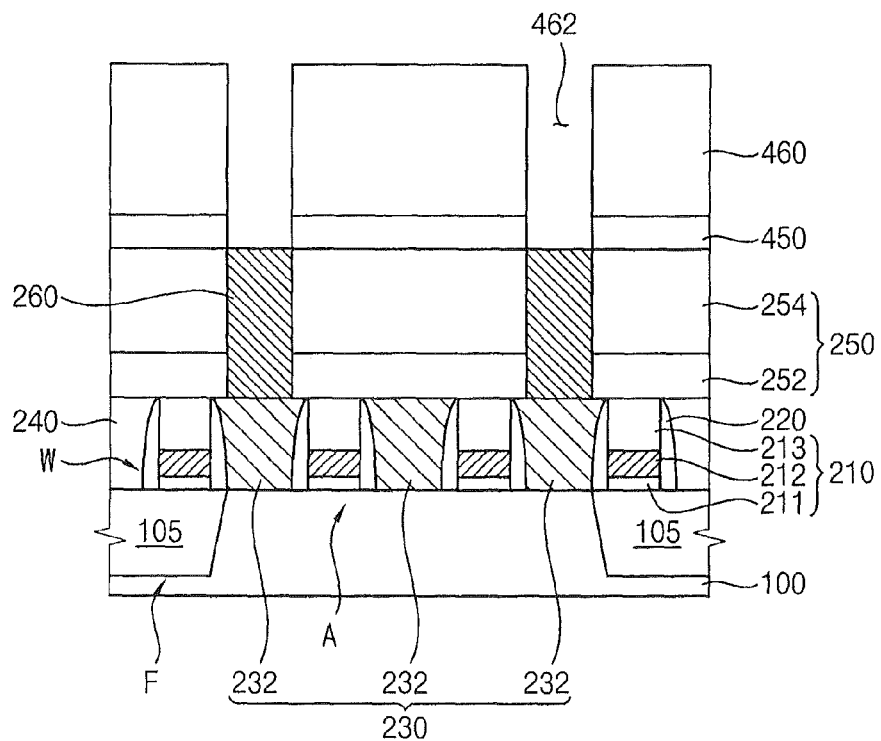
FIGS. 3A to 3D are cross-sectional views illustrating processing steps for a method of forming the semiconductor device shown in FIG. 1 in accordance with another example embodiment of the present inventive concept.

Then, as illustrated in FIG. 3A, an etch stop pattern 450 and a mold pattern 460 may be formed on the insulation interlayer pattern 250 in such a way that the buried contact 260 may be exposed through a node hole 462.

For example, an etching stop layer and a mold layer may be sequentially formed on the insulation interlayer 250 and, thus, the buried contact 260 may be covered with the etching stop layer. Then, the mold layer and the etching stop layer may be sequentially and partially removed from the buried contact 260 in such a way that the buried contact 260 may be exposed, thereby forming the etch stop pattern 450 and the mold pattern 460 having the node hole 462 through which the buried contact 260 may be exposed.

The etch stop pattern 450 and the mold pattern 460 may have the same structure as the etch stop pattern 410 and the mold pattern 420 described in detail with reference to FIG. 2G, and, thus, any further detailed descriptions on the etching stop pattern 450 and the mold pattern 460 will be omitted.

Figure 3B:
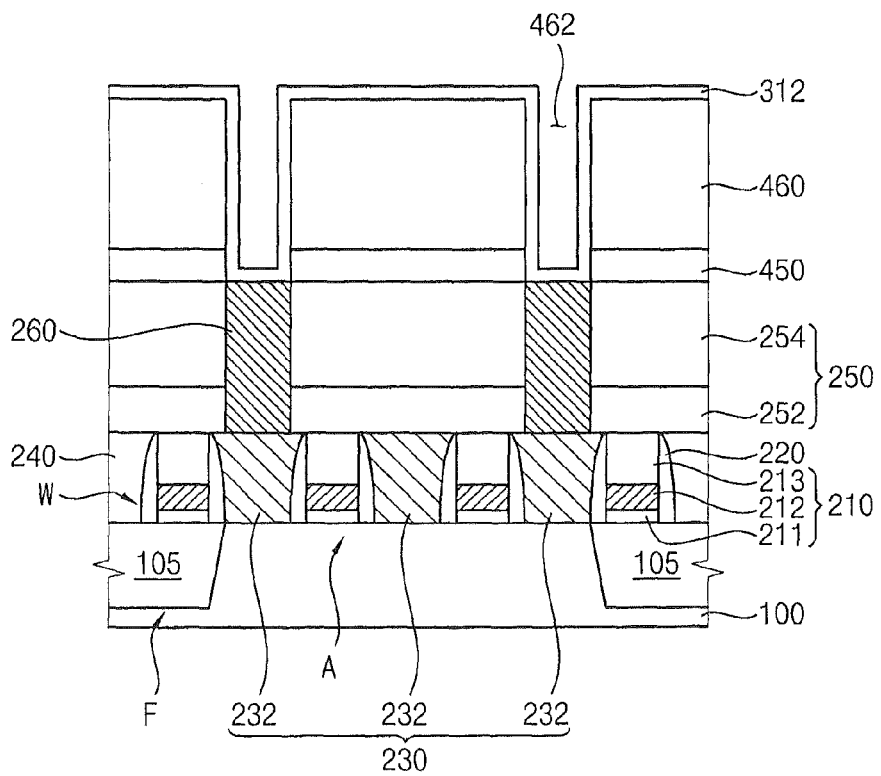

Referring to FIG. 3B, a metal layer 312 may be formed on the mold pattern 460 and a sidewall and a bottom of the node hole 462.

For example, the metal layer 312 may comprise a low resistance metal and may be formed by a deposition process, such as a physical vapor deposition (PVD) process, a chemical vapor deposition (CVD) process, an atomic layer deposition (ALD) process, a plasma enhanced CVD (PECVD) process, and a cyclic CVD process. Examples of the low resistance metal may include nickel (Ni), platinum (Pt), titanium (Ti), ruthenium (Ru), rhodium (Rh), cobalt (Co), hafnium (Hf), tantalum (Ta), erbium (Er), ytterbium (Yb), tungsten (W), etc. These may be used alone or in combinations thereof.

The metal layer 312 may have the same structure and compositions as the metal layer 310 and may be formed by the same process as described in detail with reference to FIG. 2C except for the process conditions. Because the metal layer 312 may be formed along the profile of the node hole 462, the deposition process for forming the metal layer 312 may be performed at process conditions for sufficient step coverage as compared with the process conditions for forming the metal layer 310.

Figure 3C:
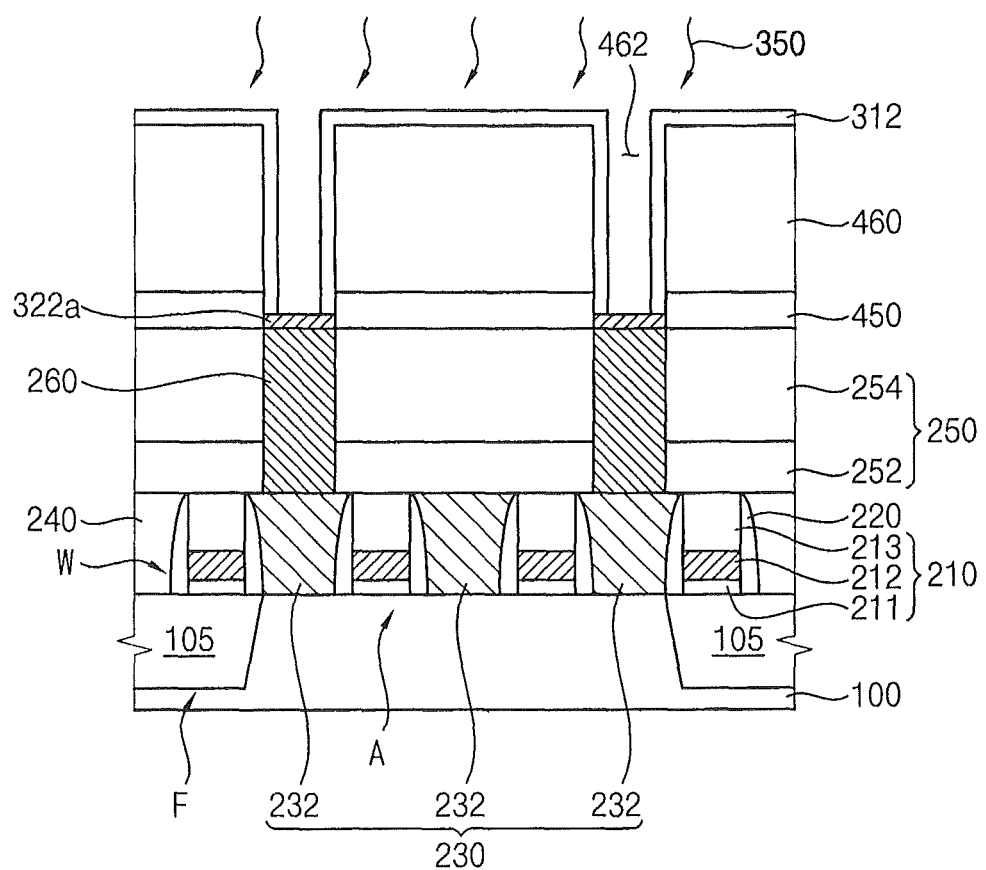

Referring to FIG. 3C, the first heat treatment 350 may be performed on the metal layer 312 at the first temperature, to thereby transform a portion of the metal layer 312 making contact with the buried contact 260 into a preliminary metal silicide layer 322a. The first temperature may be relatively lower than the second temperature of the subsequent second heat treatment. Because the mold pattern 460 may comprise an oxide without silicon (Si), no silicidation process may occur at the metal layer 312 on the sidewalls of the node hole 462 and on the mold pattern 460.

The first heat treatment 350 may be performed in the same way as described with reference to FIG. 1D, and thus any further detailed descriptions on the first heat treatment will be omitted. In the present example embodiment, the preliminary metal silicide layer 320a may comprise dinickel silicide (Ni2Si) or dinickel platinum silicide (NiPt)2Si).

Figure 3D:
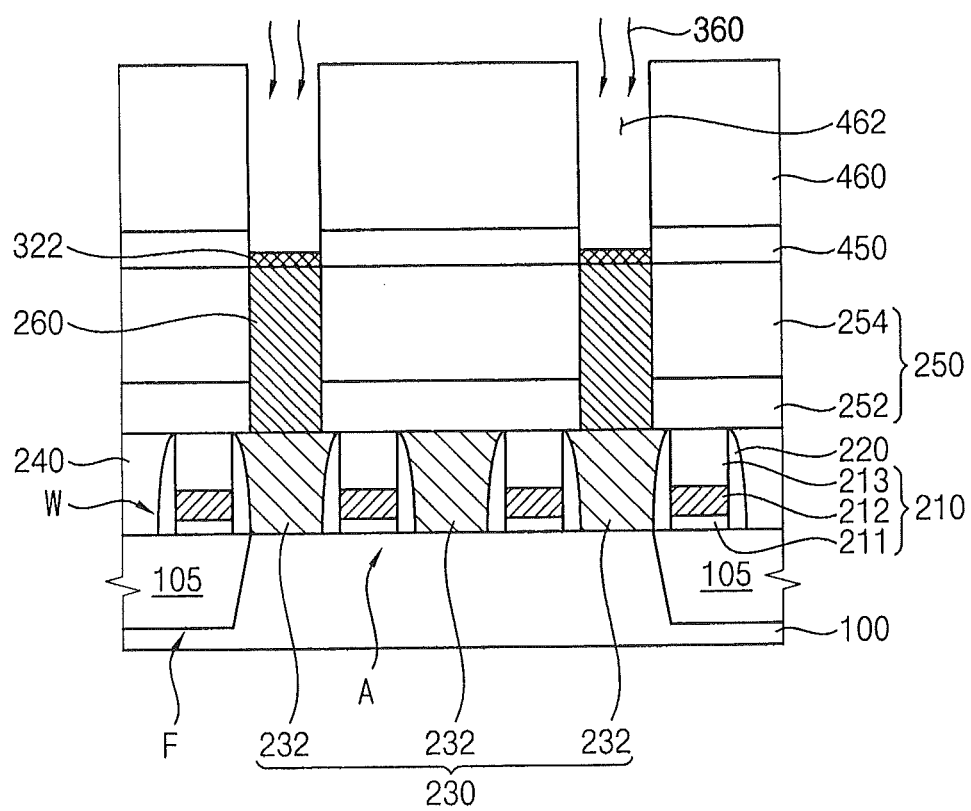

Referring to FIG. 3D, residuals of the metal layer 312 that may not have participated in the above silicidation process may be removed from the mold pattern 460 by a dry etching process, and, thus, the preliminary metal silicide layer 322a may remain on the buried contact 260 in the node hole 462. The dry etching process for removing the residuals of the metal layer 312 may be performed substantially in the same way as described in detail with reference to FIG. 2E, and, thus, any detailed descriptions of the dry etching process will be omitted.

Then, the second heat treatment 360 may be performed on the preliminary metal silicide layer 322a in the same way as described with reference to FIG. 2F, to thereby form the thermo-stable metal silicide layer 322 on the buried contact 260. Therefore, the second heat treatment 360 may include an MSA process that may be instantaneously performed just on the preliminary metal silicide layer 322a.

After completing the instantaneous MSA process, the composition of the preliminary metal silicide may be re-crystallized into a silicon-rich composition from the metal-rich composition under the instantaneous melting state. The energy level of the chemical bonding between metal and silicon in the metal-rich metal silicide may be lowered when the metal silicide is melted, and, thus, the re-crystallization after the MSA process may stabilize the chemical bonding of the metal silicide 322. That is, the preliminary metal silicide layer 320a may be formed into the thermo-stable metal silicide layer 322 by the MSA process.

Therefore, the thermo-stable metal silicide layer 322 may be formed on the buried contact 260 by the second heat treatment 360. Since the chemical bonding between metal and silicon (Si) may have a low energy level and, thus, may be sufficiently stable in the metal silicide layer 322, the agglomeration and void may be scarcely found in the metal silicide layer 322. In the present example embodiment, the metal silicide layer 322 may include mono nickel silicide (NiSi) or mono nickel-platinum silicide ((NiPt)Si).

Particularly, because the second heat treatment 360 may be instantaneously performed just on the preliminary metal silicide layer 322a, the heat in the second heat treatment 360 may have substantially no effect on the word line W and a peripheral region of the substrate 100 underlying the insulation interlayer 250. As a result, the impurities of the junction area may be sufficiently prevented from agglomerating around the word line W and the peripheral region in spite of the high temperature second heat treatment 360.

Thereafter, the same process as described with reference to FIGS. 2H to 2I may be performed on the mold pattern 460 and, thus, the lower electrode, the dielectric layer and the upper electrode may be sequentially formed on the metal silicide layer 322, to thereby form the semiconductor device shown in FIG. 1.

According to the above-described method of manufacturing the semiconductor device, the metal silicide layer interposed between the lower electrode and the storage node contact plug as an ohmic layer may be formed by a relatively low temperature heat treatment and a relatively high temperature heat treatment consecutively performed, to thereby sufficiently improve thermal stability of the ohmic layer. Particularly, the high temperature heat treatment may include an MSA process that may be instantaneously and locally performed just at the metal silicide layer. The instantaneous melting of the MSA process and the re-crystallization of the metal and silicon after completing the MSA process may sufficiently stabilize the bonding structure of the metal silicide layer.

Therefore, the agglomeration of the metal silicide layer may be sufficiently reduced or prevented in subsequent high temperature processes, thereby reducing or preventing the increase of the sheet resistance of the ohmic layer. Particularly, nickel (Ni) has advantages in the silicidation process in that the reacting dose of silicon is relatively small and a specific resistance is also lower as compared with titanium (Ti) and cobalt (Co). In spite of the above merits, nickel (Ni) has a fatal demerit in that the bonding structure with silicon (Si) is easily changed by heat in a subsequent heat treatment. For those reasons, nickel (Ni) has been difficult for adopting as the ohmic layer of the DRAM device. However, the MSA process makes it possible for nickel (Ni) to be used for the ohmic layer of the DRAM device.

Electronic System Including the Semiconductor Device

Figure 4:
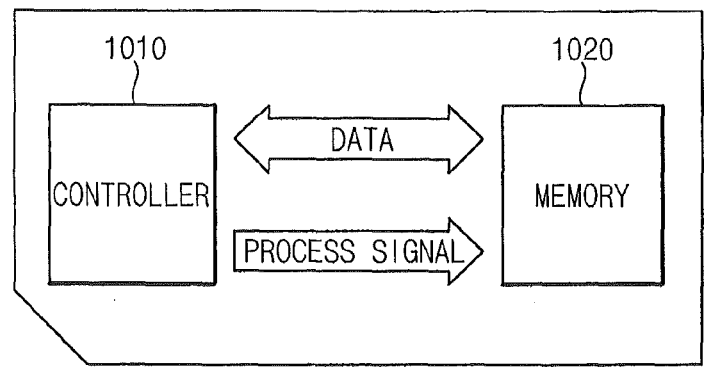
FIG. 4 is a block diagram illustrating a memory card in accordance with an example embodiment of the present inventive concept.

FIG. 4 is a block diagram illustrating a memory card in accordance with an example embodiment of the present inventive concept.

Referring to FIG. 4, a memory card 1000 in accordance with an example embodiment of the present inventive concept may include a controller 1010 for controlling data storing and output and a memory unit 1020 for storing the data according to signals from the controller 1010. The controller 1010 may transfer process signals to the memory unit 1020 to thereby allocate addresses for storing/outputting data to/from the memory unit 1020. The memory unit 1020 may store data in the allocated addresses and may transfer the data stored in the allocated addresses to the controller 1010 by the process signals. The data may be processed in the controller 1010 or may be transferred out of the memory card 1000.

Therefore, the controller 1010 may include a processor communicating data with the memory unit 1020 and the memory unit 1020 may include a DRAM device shown in FIG. 1. That is, the memory unit 1020 may include an ohmic layer interposed between a lower electrode of a capacitor and a storage node contact plug and comprising mono nickel silicide (NiSi) and, thus, the contact resistance between the capacitor and the storage node contact plug may be reduced or minimized. Therefore, the memory unit 1020 can operate at high speed with improved reliability.

Figure 5:
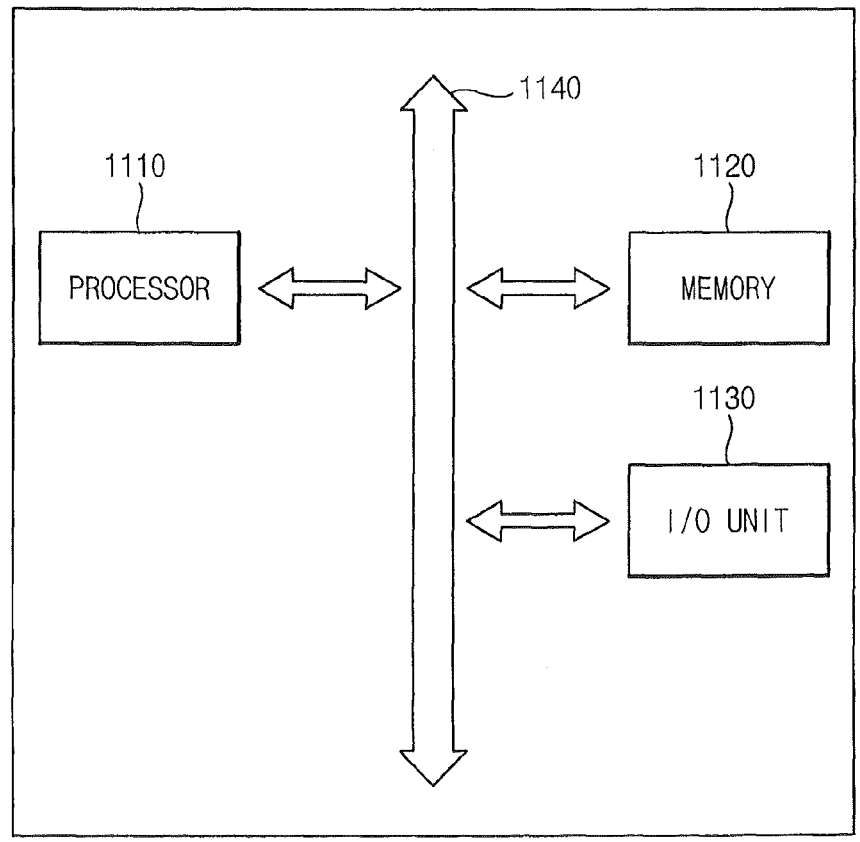
FIG. 5 is a block diagram illustrating an electronic system in accordance with an example embodiment of the present inventive concept.

FIG. 5 is a block diagram illustrating an electronic system in accordance with an example embodiment of the present inventive concept.

Referring to FIG. 5, an electronic system 1100 in accordance with an example embodiment of the present inventive concept may include a processor 1110 for processing data, a memory unit 1120 for storing data, an I/O unit 1130 for mutually transferring data with surroundings and a data line 1140 for communicating data between the processor 1110, the memory unit 1120 and the I/O unit 1130.

The processor 1110 may execute programs and control the electronic system 1100. The data may be transferred into or out of the electronic system 1100 via the I/O unit 1130.

The memory unit 1120 may include an operation code for operating the processor 1110 and a plurality of memory cells for storing the data. For example, the memory unit 1120 may include the DRAM device shown in FIG. 1 in which the thermo-stable metal silicide layer may be used as an ohmic layer. Thus, the contact resistance between the access transistor and the capacitor of the DRAM device may be reduced or minimized due to the thermo-stable ohmic layer and, thus, the operation speed of the memory unit 1120 may be sufficiently increased.

The electronic system 1100 may be installed in various electronic appliances in which the memory unit may be essential, such as a mobile phone, an MP3 player, a navigation system, a solid state disk (SSD) and various household appliances.

According to the present example embodiments, the metal silicide layer interposed between the lower electrode and the storage node contact plug as an ohmic layer may be formed by a relatively low temperature heat treatment and a relatively high temperature heat treatment consecutively performed, to thereby sufficiently improve thermal stability of the ohmic layer. Particularly, the high temperature heat treatment may include an MSA process that may be instantaneously and locally performed just on the metal silicide layer. The instantaneous melting of the MSA process and the re-crystallization of the metal and silicon after completing the MSA process may sufficiently stabilize the bonding structure of the metal silicide layer.

Therefore, the agglomeration of the metal silicide layer may be sufficiently reduced or prevented in subsequent high temperature processes, thereby reducing or preventing the increase of the sheet resistance of the ohmic layer. Particularly, nickel (Ni) has advantages in silicidation process in that reacting dose of silicon is relatively small and a specific resistance is also lower as compared with titanium (Ti) and cobalt (Co). In spite of the above merits, nickel (Ni) has a fatal demerit in that the bonding structure with silicon (Si) is easily changed by heat in a subsequent heat treatment. For those reasons, nickel (Ni) has been difficult for adopting as the ohmic layer of the DRAM device. However, the MSA process makes it possible for nickel (Ni) to be used for the ohmic layer of the DRAM device.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, comprising:
forming an insulation interlayer on a substrate such that conductive structures on the substrate are covered with the insulation interlayer and a buried contact makes contact with the conductive structures through the insulation interlayer;
forming a mold pattern on the insulation interlayer, the mold pattern having a node hole through which the buried contact covered with a metal silicide layer is exposed and the metal silicide layer being formed by a first heat treatment under a first temperature and a second heat treatment under a second temperature higher than the first temperature;
forming a cylindrical node-separated lower electrode on a sidewall of the node hole and on the metal silicide layer in the node hole of the mold pattern;
removing the mold pattern from the insulation interlayer, thereby exposing the cylindrical lower electrode;
forming a dielectric layer such that the cylindrical lower electrode is covered with the dielectric layer; and
forming an upper electrode on the dielectric layer;
wherein forming the mold pattern through which the metal silicide layer is exposed comprises:
forming a metal layer on the insulation interlayer and the buried contact;
performing the first heat treatment on the metal layer, thereby forming a preliminary metal silicide layer on the buried contact by a silicidation process between silicon of the buried contact and metal of the metal layer;
removing residuals of the metal layer that did not participate in the silicidation process; instantaneously performing the second heat treatment on the preliminary metal silicide layer, thereby forming a metal silicide layer on the buried contact;
sequentially forming an etch stop layer and a mold layer on the insulation interlayer and the metal silicide layer; and
sequentially and partially removing the mold layer and the etch stop layer, thereby forming the node hole penetrating through the mold layer and the etch stop layer such that the metal silicide layer is exposed through the node hole.

2. The method of claim 1, wherein the first heat treatment includes a rapid thermal process (RTP) and the second heat treatment includes a millisecond annealing (MSA) process.

3. The method of claim 2, wherein the RTP process is performed at a temperature of about 250° C. to about 350° C. and the MSA process is performed for about 10 nanoseconds to about 5 milliseconds at a temperature of about 1,000° C. to about 1,400° C.

4. The method of claim 3, wherein the MSA process includes one of a laser annealing process and a ramp type flash annealing process.

5. The method of claim 1, wherein the metal silicide layer includes one of mono nickel silicide (NiSi) and mono nickel platinum silicide ((NiPt)Si).

6. A method of manufacturing a semiconductor device, comprising:
forming an insulation interlayer on a substrate such that conductive structures on the substrate are covered with the insulation interlayer and a buried contact makes contact with the conductive structures through the insulation interlayer;
forming a mold pattern on the insulation interlayer, the mold pattern having a node hole through which the buried contact covered with a metal silicide layer is exposed and the metal silicide layer being formed by a first heat treatment under a first temperature and a second heat treatment under a second temperature higher than the first temperature;
forming a cylindrical node-separated lower electrode on a sidewall of the node hole and on the metal silicide layer in the node hole of the mold pattern;
removing the mold pattern from the insulation interlayer, thereby exposing the cylindrical lower electrode;
forming a dielectric layer such that the cylindrical lower electrode is covered with the dielectric layer; and
forming an upper electrode on the dielectric layer;
wherein forming the mold pattern comprises forming a metal layer on the insulation interlayer and the buried contact, performing the first heat treatment on the metal layer to form a preliminary metal silicide layer by a silicidation process, removing residuals of the metal layer that did not participate in the silicidation process, performing the second heat treatment on the preliminary metal silicide layer to form the metal silicide layer on the buried contact, sequentially forming an etch stop layer and a mold layer on the insulation interlayer and the metal silicide layer, sequentially and partially removing portions of the mold layer and the etch stop layer to form the node hole penetrating through the mold layer and the etch stop layer such that the metal silicide layer is exposed through the node hole
wherein the metal silicide layer includes one of mono nickel silicide (NiSi) and mono nickel platinum silicide ((NiPt)Si); and
wherein forming the cylindrical node-separated lower electrode includes forming a metal nitride layer on the sidewall of the node hole, on a surface of the metal silicide layer and on a surface of the mold pattern by a deposition process under a temperature of about 700° C. to about 800° C.

7. A method of manufacturing a semiconductor device, comprising:
forming a buried contact on a substrate such that the buried contact is exposed through an insulation interlayer on the substrate;
forming a metal silicide layer on the buried contact wherein the metal silicide layer is formed by a first heat treatment under a first temperature and a second heat treatment under a second temperature greater than the first temperature;
forming a mold pattern on the insulation interlayer, the mold pattern having a node hole through which the buried contact covered with the metal silicide layer is exposed,
wherein forming the mold pattern comprises sequentially forming an etch stop layer and a mold layer on the insulation interlayer and the metal silicide layer, sequentially and partially removing portions of the mold layer and the etch stop layer to form the node hole penetrating through the mold layer and the etch stop layer such that the metal silicide layer is exposed through the node hole; and forming a cylindrical node-separated lower electrode on a sidewall of the node hole;

wherein the metal silicide layer comprises one of mono nickel silicide (NiSi) and mono nickel platinum silicide ((NiPt)Si); and wherein forming the cylindrical node-separated lower electrode comprises forming a metal nitride layer on the sidewall of the node hole, on a surface of the metal silicide layer and on a surface of the mold pattern by a deposition process under a temperature of about 700° C. to about 800° C.

8. The method of claim 7, wherein the first heat treatment comprises a rapid thermal process (RTP) and the second heat treatment comprises a millisecond annealing process (MSA).

9. The method of claim 8, wherein the RTP process is performed at a temperature of about 250° C. to about 350° C. and the MSA process is performed for about 10 nanoseconds to about 5 milliseconds at a temperature of about 1,000° C. to about 1,400° C.

10. The method of claim 9, wherein the MSA process comprises one of a laser annealing process and a ramp type flash annealing process.

* * * * *